(12) United States Patent
Doya

(10) Patent No.: US 11,091,837 B2
(45) Date of Patent: Aug. 17, 2021

(54) FLUID CONTROL SYSTEM AND PRODUCT MANUFACTURING METHOD USING FLUID CONTROL SYSTEM

(71) Applicant: FUJIKIN INCORPORATED, Osaka (JP)

(72) Inventor: Hidehiro Doya, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 226 days.

(21) Appl. No.: 16/344,235

(22) PCT Filed: Oct. 12, 2017

(86) PCT No.: PCT/JP2017/037042
§ 371 (c)(1),
(2) Date: Apr. 23, 2019

(87) PCT Pub. No.: WO2018/079288
PCT Pub. Date: May 3, 2018

(65) Prior Publication Data
US 2019/0264326 A1  Aug. 29, 2019

(30) Foreign Application Priority Data
Oct. 24, 2016  (JP) .............................. JP2016-207603

(51) Int. Cl.
*C23C 16/52* (2006.01)
*C23C 16/455* (2006.01)
(Continued)

(52) U.S. Cl.
CPC ........ *C23C 16/52* (2013.01); *C23C 16/45527* (2013.01); *C23C 16/45544* (2013.01);
(Continued)

(58) Field of Classification Search
CPC .............. C23C 16/52; C23C 16/45561; C23C 16/45527; C23C 16/45544; F16K 27/00;
(Continued)

(56) References Cited

U.S. PATENT DOCUMENTS 5,771,919 A * 6/1998 Itoi ...................... F16K 27/003
137/454.6
6,648,020 B2 * 11/2003 Fujimoto .............. F16K 27/003
137/343
(Continued)

FOREIGN PATENT DOCUMENTS

JP      10-227368 A     8/1998
JP      2005-539375 A   12/2005
(Continued)

OTHER PUBLICATIONS

Official Communication issued in International Bureau of WIPO Patent Application No. PCT/JP2017/037042, dated Nov. 21, 2017.
(Continued)

*Primary Examiner* — Jeffrie R Lund
(74) *Attorney, Agent, or Firm* — Greenblum & Bernstein, P.L.C.

(57) ABSTRACT

A fluid control system is provided which, without reducing the supply flow rate of a fluid, is considerably more miniaturized and integrated. This fluid control system includes base blocks and fluid devices respectively installed on upper surfaces of the base blocks. The base blocks each include protruding pipe parts protruding in a longitudinal direction. The protruding pipe parts each communicate with a corresponding second flow path. The protruding pipe part on a downstream side end surface of the base block and the protruding pipe part on an upstream side end surface of the base block are air-tightly or liquid-tightly connected to each other by a welding material.

8 Claims, 17 Drawing Sheets

(51) Int. Cl.
*H01L 21/02* (2006.01)
*F16K 27/00* (2006.01)
*H01L 21/67* (2006.01)

(52) U.S. Cl.
CPC ........ *C23C 16/45561* (2013.01); *F16K 27/00* (2013.01); *H01L 21/02* (2013.01); *H01L 21/0262* (2013.01); *H01L 21/6715* (2013.01); *H01L 21/67017* (2013.01); *H01L 21/67253* (2013.01)

(58) Field of Classification Search
CPC ................. H01L 21/02; H01L 21/0262; H01L 21/67017; H01L 21/6715; H01L 21/67253
See application file for complete search history.

(56) References Cited

U.S. PATENT DOCUMENTS

| | | | |
|---|---|---|---|
| 10,895,329 B2* | 1/2021 | Doya | F16K 27/00 |
| 2004/0129324 A1 | 7/2004 | Vu | |
| 2006/0011247 A1 | 1/2006 | Vu | |
| 2010/0132808 A1 | 6/2010 | Nakata et al. | |
| 2018/0299045 A1* | 10/2018 | Nakata | F16L 19/103 |
| 2019/0085444 A1* | 3/2019 | Shimizu | C23C 16/45561 |
| 2019/0162323 A1* | 5/2019 | Aikawa | F16K 27/003 |
| 2019/0195378 A1* | 6/2019 | Aikawa | F17D 3/01 |
| 2019/0264326 A1* | 8/2019 | Doya | C23C 16/45544 |
| 2019/0271402 A1* | 9/2019 | Doya | F16K 27/003 |
| 2019/0390811 A1* | 12/2019 | Shibata | F16L 41/025 |
| 2020/0248310 A1* | 8/2020 | Aikawa | F16J 13/06 |

FOREIGN PATENT DOCUMENTS

| | | |
|---|---|---|
| JP | 2008-298177 A | 12/2008 |
| JP | 2008-298179 A | 12/2008 |
| KR | 1999-023751 A | 3/1999 |
| KR | 10-2015-0065585 A | 6/2015 |

OTHER PUBLICATIONS

Search Report from Korea Patent Office received in Korean Appl. No. KR20197014791, dated Jul. 31, 2020.

* cited by examiner

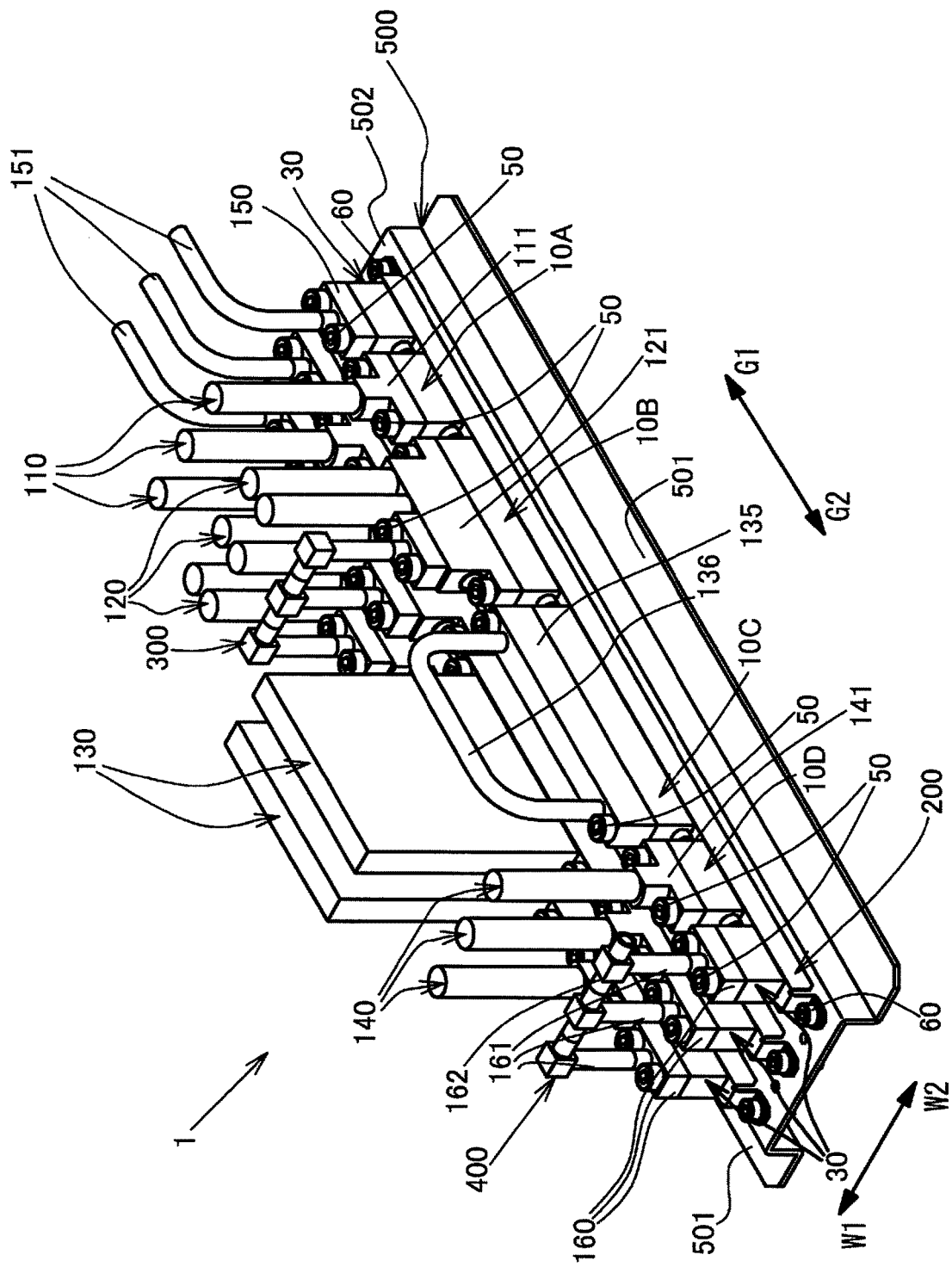

FLUID CONTROL SYSTEM AND PRODUCT MANUFACTURING METHOD USING FLUID CONTROL SYSTEM

FIELD OF THE INVENTION

The present invention relates to a fluid control system in which fluid devices including a fluid control device are integrated, and a product manufacturing method that uses this fluid control system.

DESCRIPTION OF THE BACKGROUND ART

In various manufacturing processes such as a semiconductor manufacturing process, a fluid control system called an integrated gas system in which various fluid control devices, such as a switch valve, a regulator, and a mass flow controller, are integrated and housed in a box, is used to supply an accurately measured process gas to a process chamber. This box with the integrated gas system housed therein is called a gas box.

In such an integrated gas system as described above, integration is achieved by arranging, in place of a pipe joint, an installation block (hereinafter referred to as "base block") that forms a flow path in a longitudinal direction of a base plate, and installing various fluid devices, such as a plurality of fluid control devices and joint blocks to which pipe joints are connected, on this base block (refer to Patent Documents 1 and 2, for example).

PATENT DOCUMENTS

Patent Document 1: Japanese Laid-Open Patent Application No. H10-227368
Patent Document 2: Japanese Laid-Open Patent Application No. 2008-298177

SUMMARY OF THE INVENTION

Problems to be Solved by the Invention

To control the supply of a process gas of various manufacturing processes, higher responsiveness is required. To this end, the fluid control system needs to be made more compact and integrated to the extent possible to install the system closer to the process chamber that is the supply destination of the fluid.

Along with increase in the size of the objects to be processed, such as increase in size of the diameter of the semiconductor wafer, it becomes necessary to also increase a supply flow rate of the fluid supplied from the fluid control system into the process chamber.

To advance miniaturization and integration of the fluid control system, it is necessary to not only advance the miniaturization of the fluid control devices, but also reduce the dimensions of a base block on which the miniaturized fluid control devices are installed. Next generation fluid control systems demand a base block width of 10 mm or less.

Nevertheless, fluid control devices require a reliable seal with the base block, necessitating a space for a fastening bolt for achieving a fastening force required for such a seal. Further, in order to fix the base block to a base plate, a space for a through hole through which a fastening bolt passes is also required. Furthermore, as disclosed in Patent Document 2, when base blocks are coupled by a fastening bolt, further space for the fastening bolt is required. Thus, greatly reducing the dimensions of the base block while maintaining a cross-sectional area of the fluid flow path has not been easy.

An object of the present invention is to provide a fluid control system which, without reducing the supply flow rate of a fluid, is considerably more compact and integrated.

Another object of the present invention is to provide a fluid control system in which dimensions of a base block, particularly a width dimension, is greatly narrowed while a seal performance between the base block and various fluid devices coupled thereto is reliably secured.

Means for Solving the Problems

A fluid control system according to the present invention comprises:
first and second base blocks disposed on an upstream side and a downstream side in a predetermined direction, each defining an upper surface, a bottom surface opposite to the upper surface, and an upstream side end surface and a downstream side end surface extending from the upper surface toward the bottom surface side and opposite to each other in the predetermined direction; and
first and second fluid devices respectively installed on the upper surfaces of the first and second base blocks, and provided with a body defining a fluid flow path and two flow path ports of the fluid flow path on a bottom surface of the body, wherein:
the first and second base blocks each comprises:
an upstream side flow path and a downstream side flow path formed separately on an upstream side and a downstream side in the predetermined direction; and
an upstream side screw hole and a downstream side screw hole formed on an upstream side and a downstream side in the predetermined direction, opening on the upper surface, and extending toward the bottom surface side;
the upstream side flow path and the downstream side flow path each comprise a first flow path extending from a flow path port that opens on the upper surface toward the bottom surface, and a second flow path connected with the first flow path in an interior of the base block and extending toward the upstream side end surface or the downstream side end surface in the predetermined direction;
the upstream side screw hole and the downstream side screw hole of the first and second base blocks are each disposed so as to at least partially overlap with the corresponding second flow path in a top view, and are closed above the corresponding second flow path;
the first and second base blocks and the bodies of the first and second fluid devices are respectively coupled by a fastening force of fastening bolts passed through the bodies of the first and second fluid devices and screwed into the upstream side screw hole and the downstream side screw hole of the first and second base blocks, and seal members disposed around the flow path ports on the upper surface of the base blocks respectively abutted against the corresponding flow path ports of the bodies of the first and second fluid devices, are pressed between the first and second base blocks and the bodies of the first and second fluid devices;
the first and second base blocks each comprises protruding pipe parts that protrude from the upstream side end surface and the downstream side end surface in the predetermined direction;
the protruding pipe parts each communicate with the corresponding second flow path; and
the protruding pipe part on the downstream side end surface of the first base block and the protruding pipe part on the upstream side end surface of the second base block are air-tightly or liquid-tightly connected.

In the above-described configuration, the first and second base blocks are not provided with through holes for passing a fastening member therethrough.

A product manufacturing method of the present invention includes a step of using the fluid control system described in any one of claims 1 to 4 for controlling the process gas in a manufacturing process of a product such as a semiconductor device, a flat panel display, or a solar panel that requires a treatment process by a process gas in a sealed chamber.

Note that, while in this specification the surfaces of each member are specified using terms such as "upper surface," "lower surface," "bottom surface," "side surface," and "end surface," these terms are used to specify the relative positions of the surfaces and not necessarily used to specify the absolute positions. For example, when the term "upper surface" is used to define a specific surface and not a vertical relationship, other terms such as "bottom surface," "lower surface," and "side surface" can be relatively defined and are thus used. Similarly, terms such as "upward" and "downward" are used to define relative directions, and not necessary used to define absolute directions such as the "vertically upward."

Effect of the Invention

According to the present invention, the base block is configured as described above, making it possible to secure a flow path cross-sectional area while greatly narrowing the base block, and thus obtain a fluid control system which, without reducing the supply flow rate of a fluid, is considerably more miniaturized and integrated.

According to the present invention, the fluid devices do not extend across the base blocks, making it possible to greatly narrow dimensions, particularly a width dimension, of the base block while reliably securing seal performance between the base block and various fluid devices.

According to the present invention, the fluid control system can be made greatly more compact and integrated, making it possible to bring the fluid control system as close as possible to the vicinity of the processing chamber, increasing the responsiveness of fluid control and improving the quality of products in various manufacturing processes.

BRIEF DESCRIPTION OF THE DRAWINGS

FIG. 1B is an external perspective view from a rear side of the fluid control system in FIG. 1A.

DESCRIPTION OF THE PREFERRED EMBODIMENTS

Figure 1A:
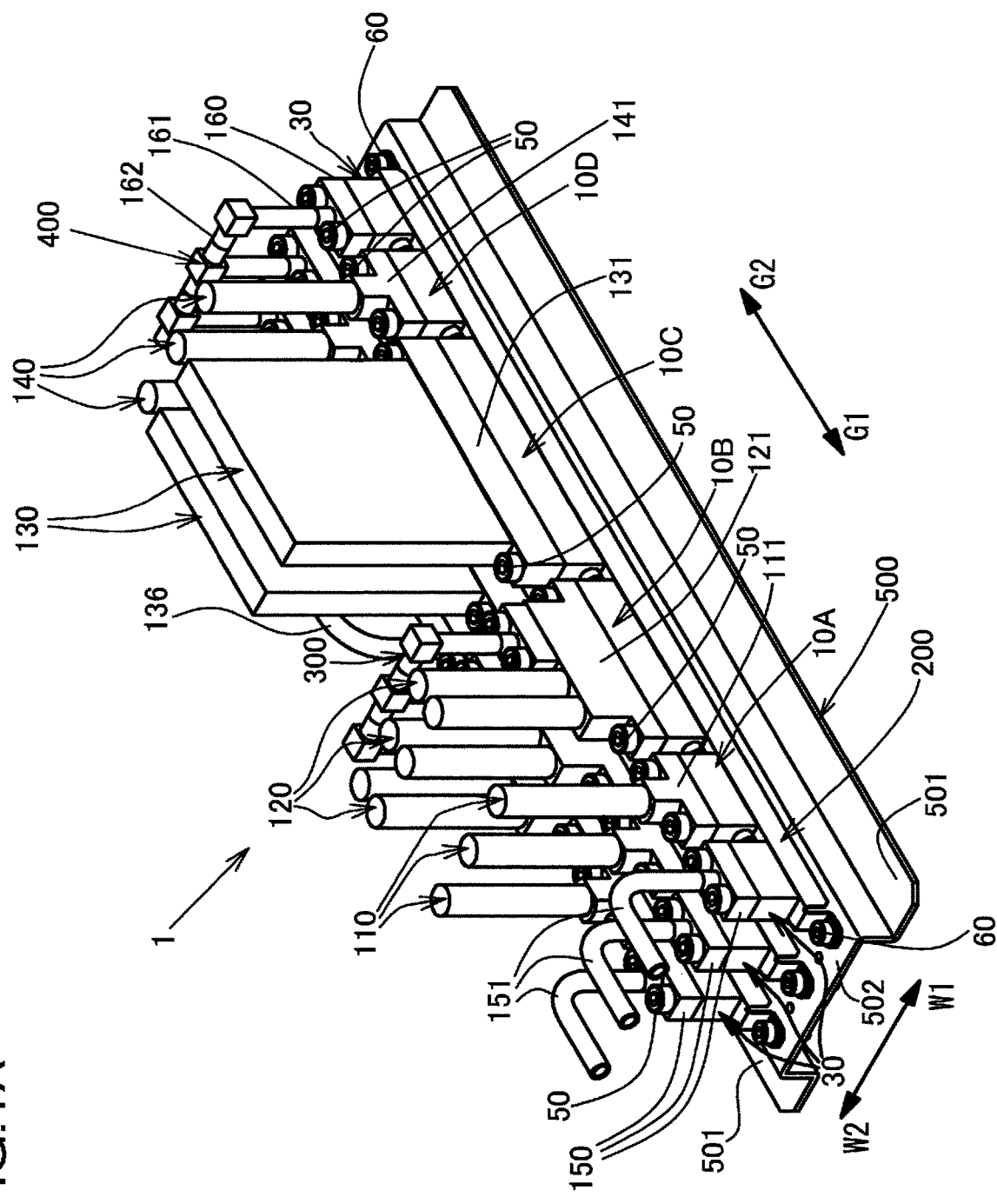
FIG. 1A is an external perspective view from a front side of a fluid control system according to a first embodiment of the present invention.

Embodiments of the present invention are described below with reference to the drawings. Note that, in this specification and the drawings, components having substantially the same function are denoted using the same reference numeral, and duplicate descriptions thereof are omitted.

Figure 1C:
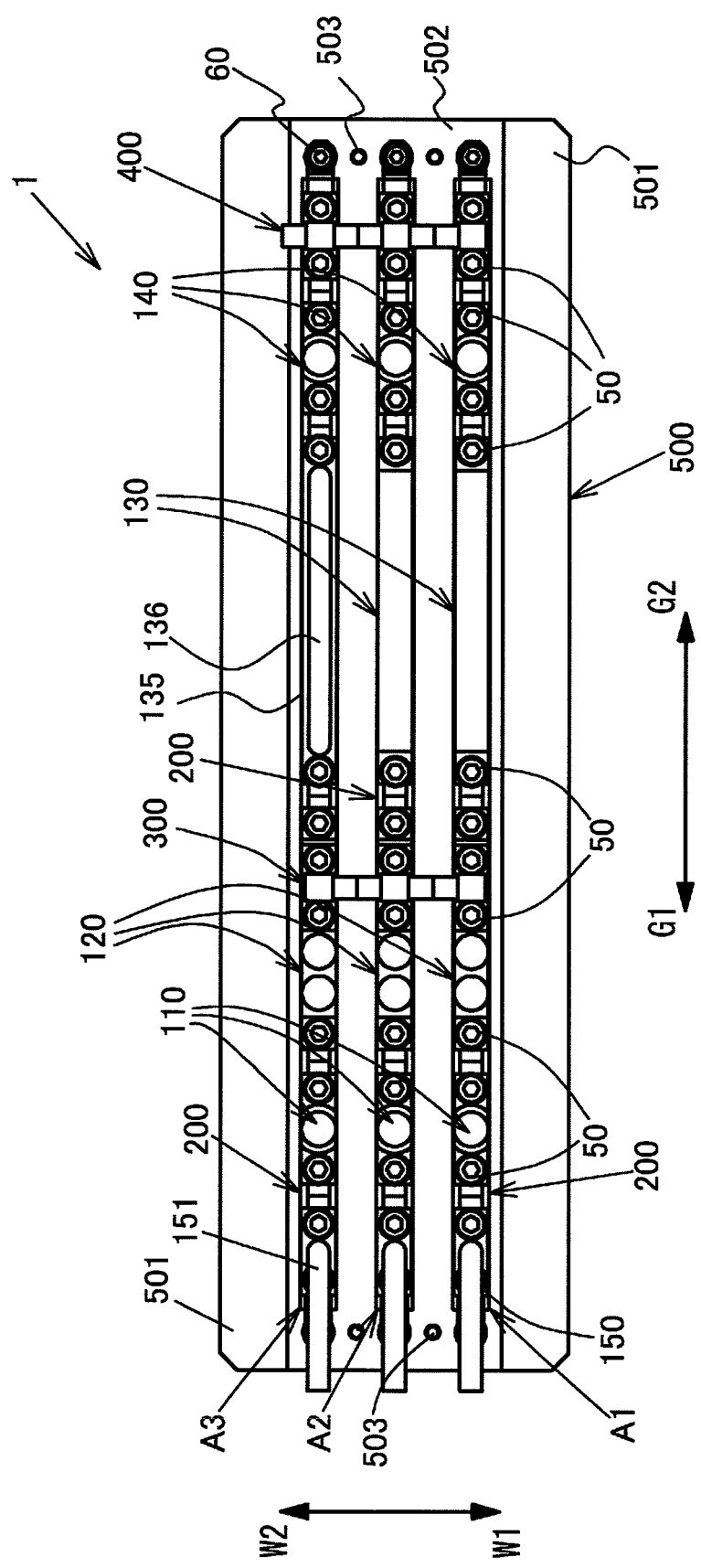
FIG. 1C is a top view of the fluid control system in FIG. 1A.
Figure 1D:
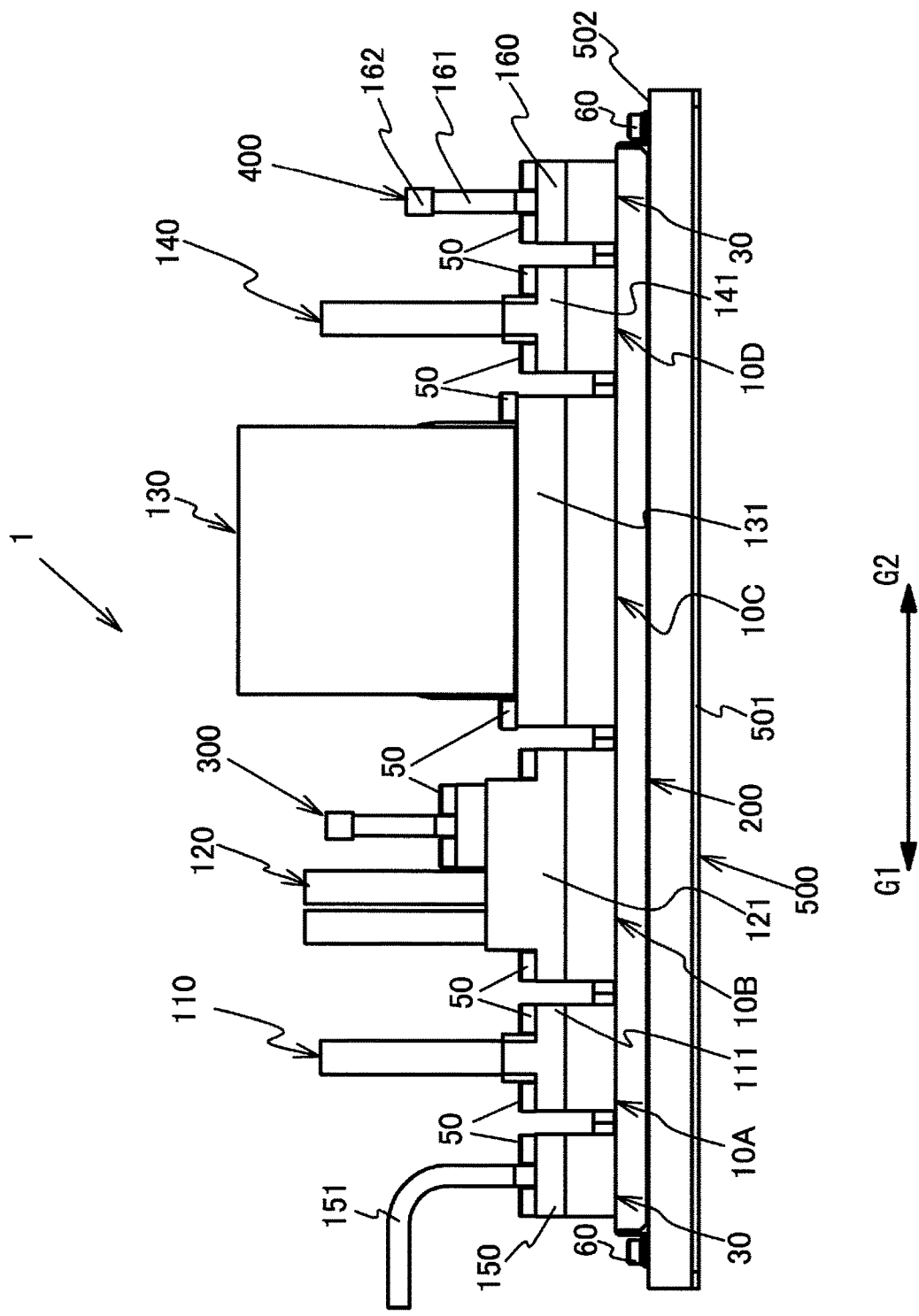
FIG. 1D is a front view of the fluid control system in FIG. 1A.
Figure 1E:
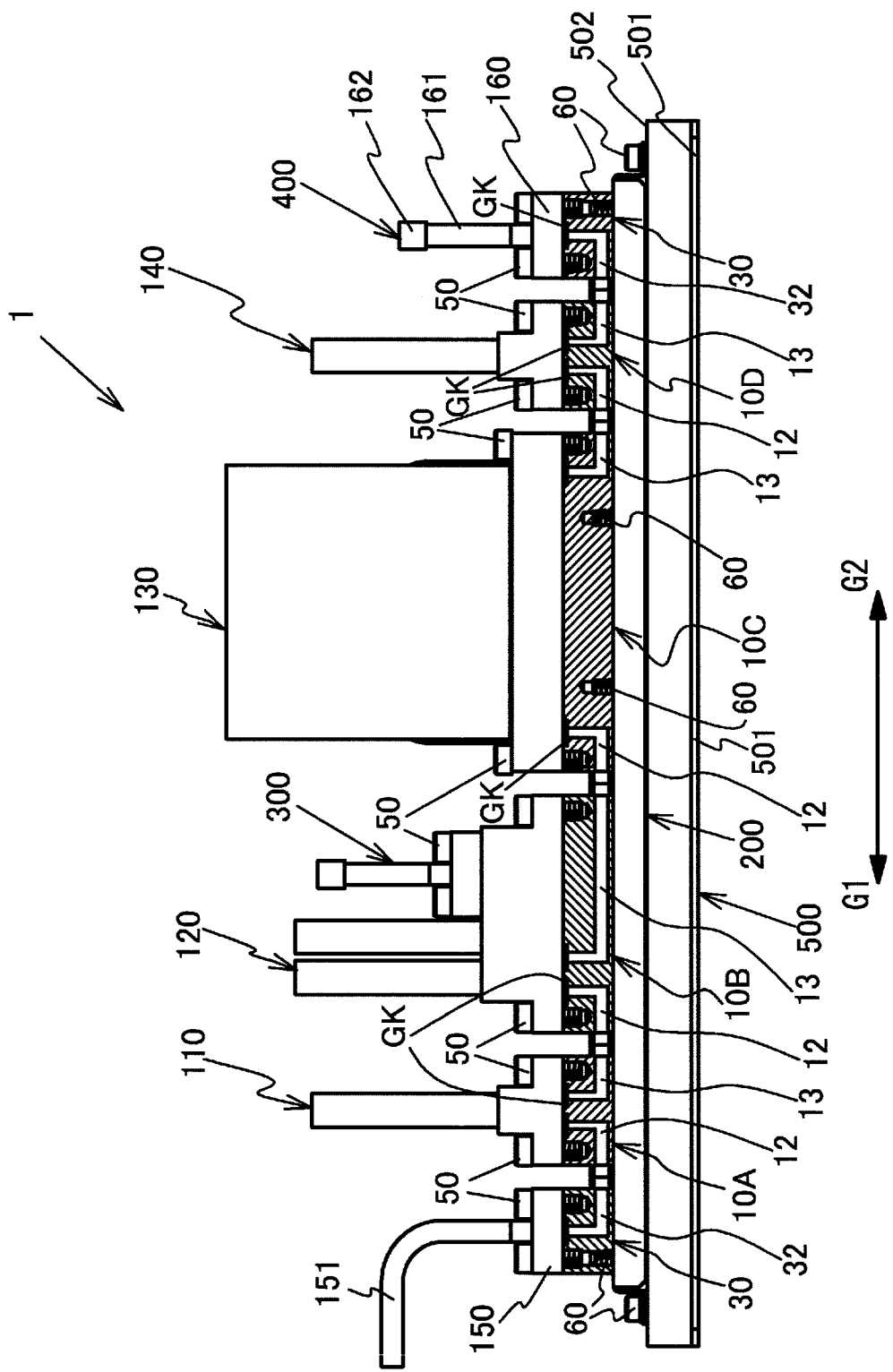
FIG. 1E is a front view including a partial cross section of only a base block in FIG. 1D.
Figure 2A:
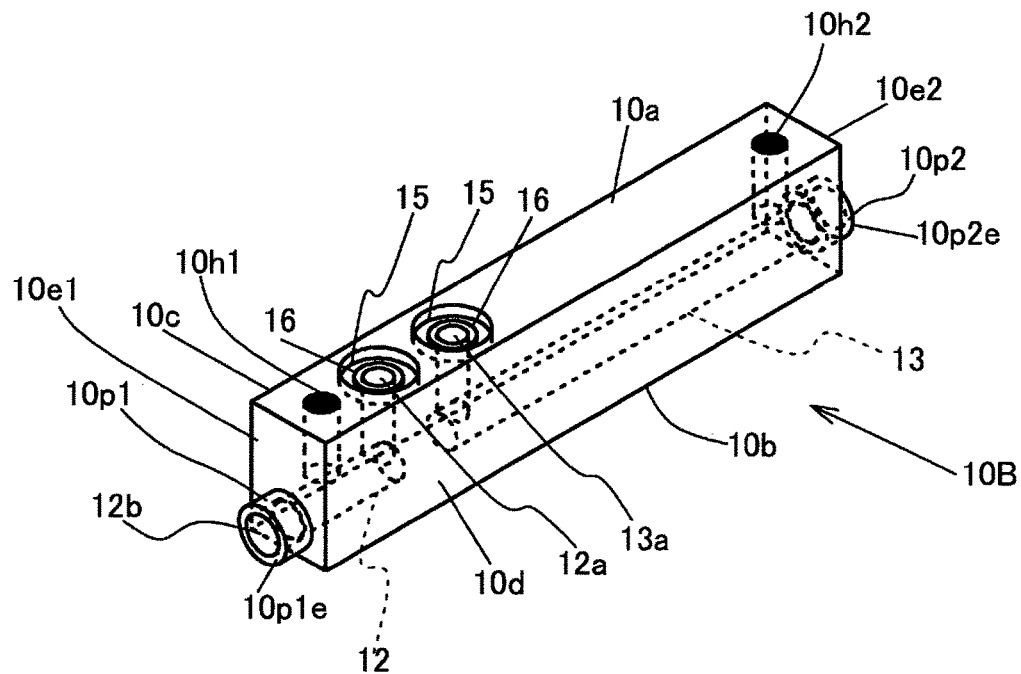
FIG. 2A is an external perspective view of a base block 10B.
Figure 2B:
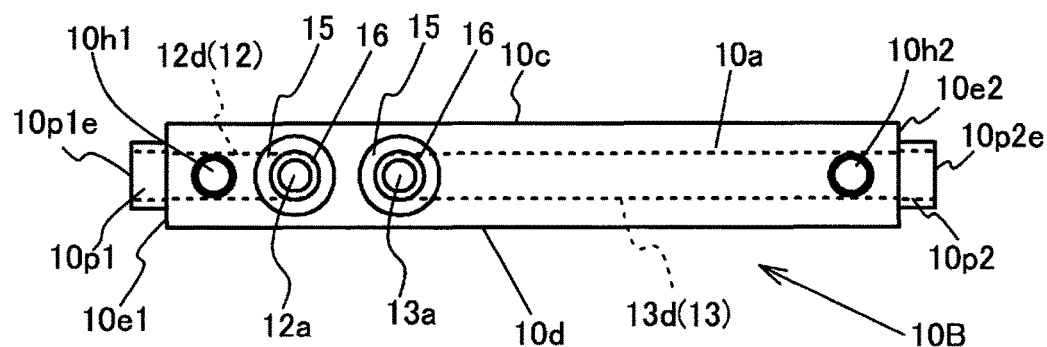
FIG. 2B is a top view of the base block 10B.
Figure 2C:
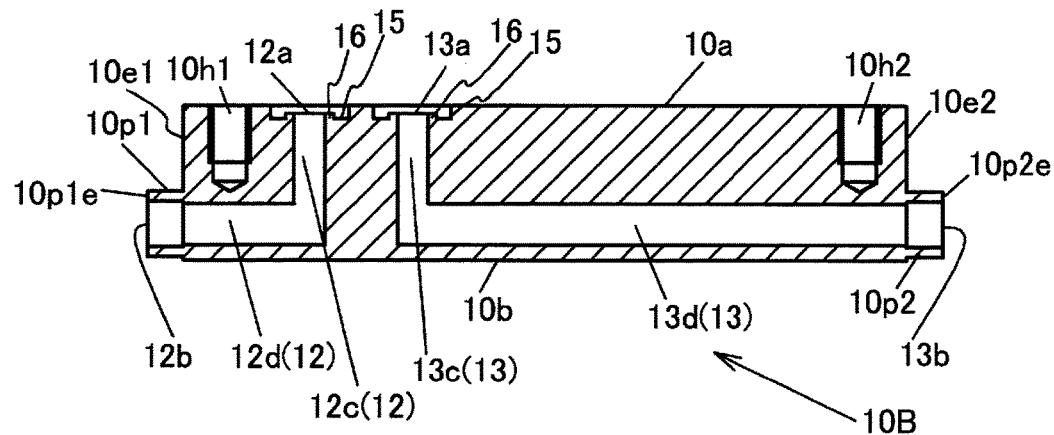
FIG. 2C is a cross-sectional view of the base block 10B in a longitudinal direction.
Figure 3A:
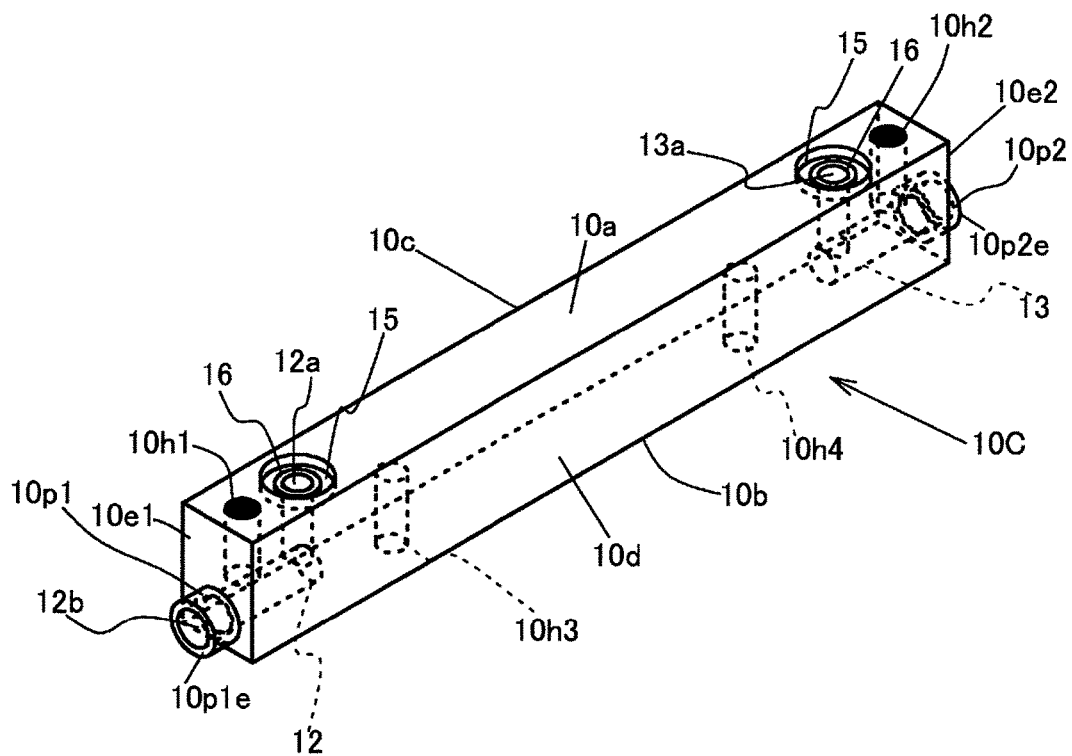
FIG. 3A is an external perspective view of a base block 10C.
Figure 3B:
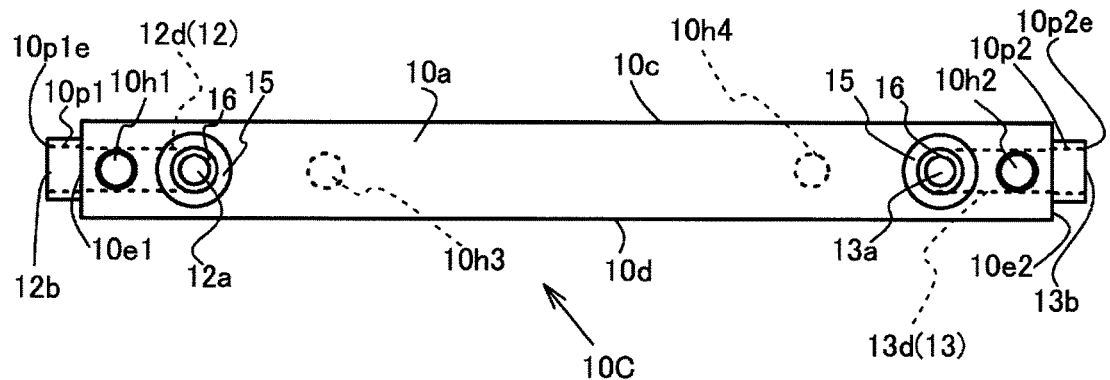
FIG. 3B is a top view of the base block 10C.
Figure 3C:
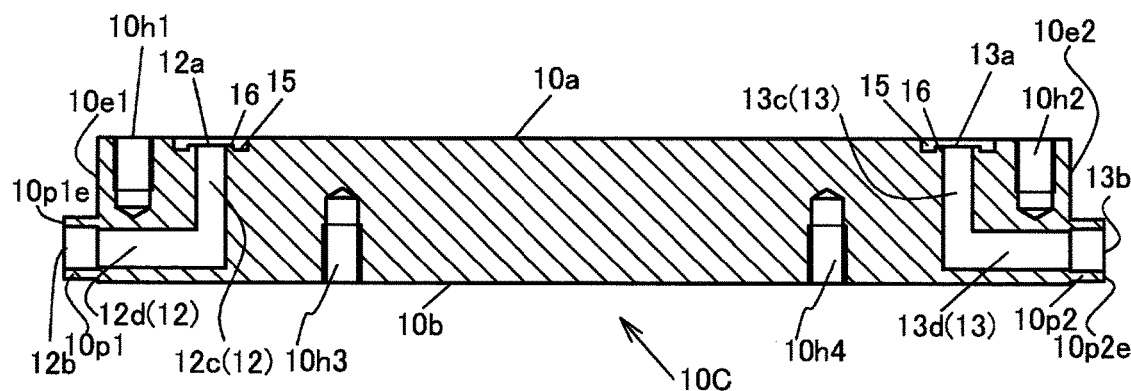
FIG. 3C is a cross-sectional view of the base block 10C in a longitudinal direction.
Figure 4A:
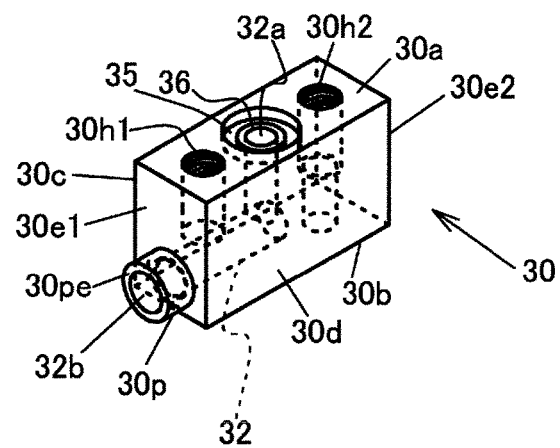
FIG. 4A is an external perspective view of a base block 30.
Figure 4B:
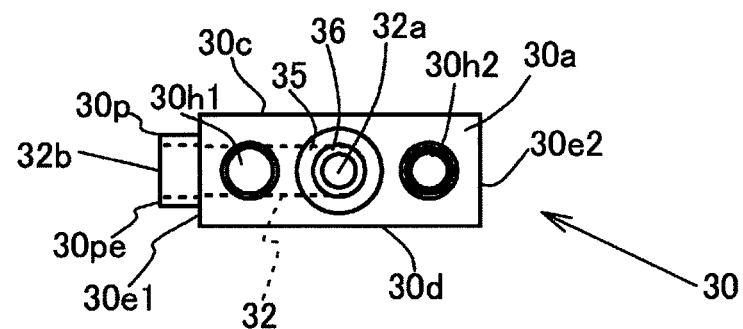
FIG. 4B is a top view of the base block 30.
Figure 4C:
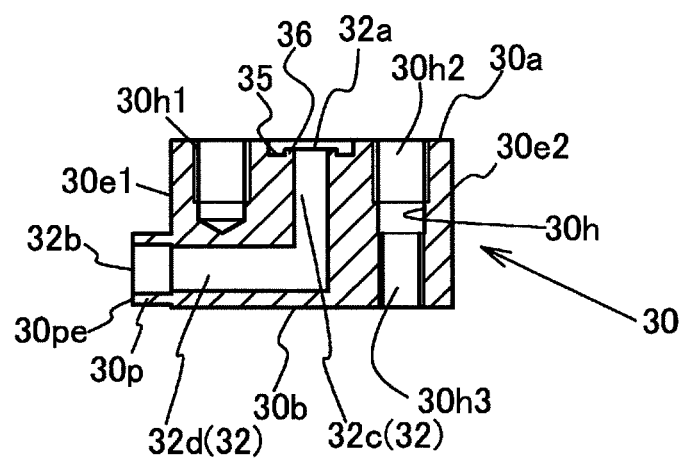
FIG. 4C is a cross-sectional view of the base block 30 in a longitudinal direction.
Figure 5:
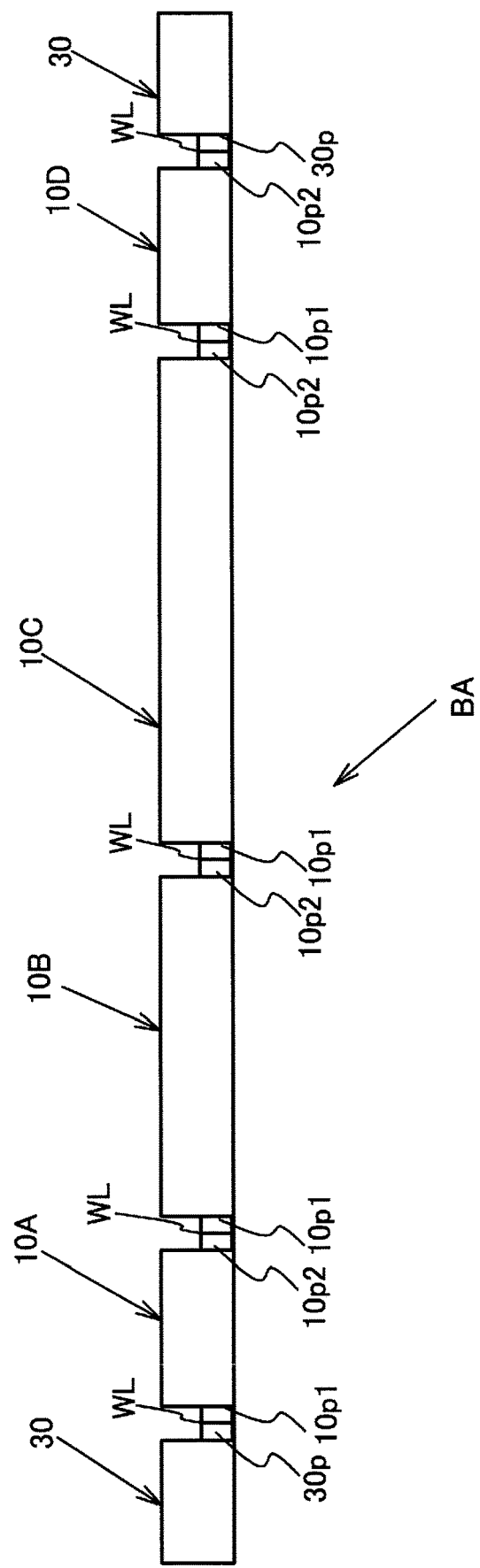
FIG. 5 is a front view of a base block assembly BA.
Figure 6A:
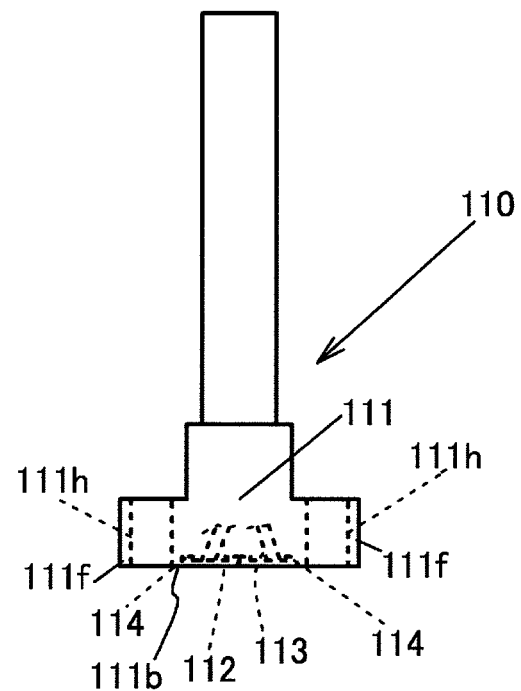
FIG. 6A is a front view of a switch valve 110.
Figure 6B:
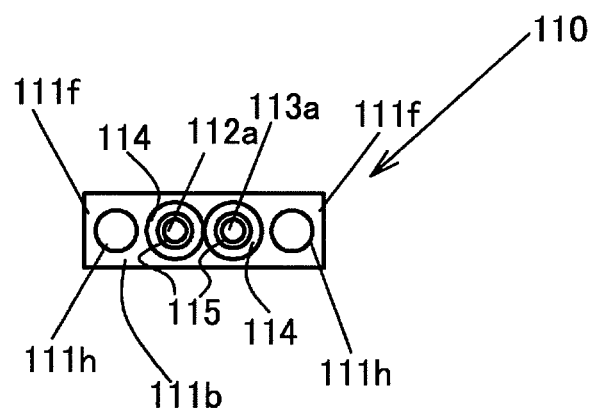
FIG. 6B is a bottom view of the switch valve 110 in FIG. 6A.

In the following, a fluid control system according to an embodiment of the present invention is described in detail with reference to FIG. 1A to FIG. 6B. FIG. 1A and FIG. 1B are perspective views illustrating the external appearance of the fluid control system according to a first embodiment of the present invention, FIG. 1C is a top view of the fluid control system in FIG. 1A, FIG. 1D is a front view of the fluid control system in FIG. 1A, and FIG. 1E is a front view including a partial cross section of only a base block in FIG. 1D. FIGS. 2A to 2C show a structure of a base block 10B, FIGS. 3A to 3C show a structure of a base block 10C, FIGS. 4A to 4C show a structure of a base block 30, and FIG. 5 show a structure of a base block assembly BA. FIGS. 6A and 6B show a structure of a switch valve 110 described later.

As illustrated in FIG. 1A to FIG. 1E, a fluid control system 1 comprises a base plate 500 and three fluid control assemblies A1, A2, A3 installed on the base plate 500. The base plate 500 comprises support parts 501 formed in both side portions in width directions W1, W2 by bending a plate made of a metal, and an installation surface 502 formed at a fixed height from the support parts 501. The fluid control assemblies A1, A2, A3 are fixed on the installation surface 502 via three holding members 200 extending in longitudinal directions G1, G2 described later. A structure of the holding members 200 is described later. Note that W1 and W2 of the width directions W1, W2 indicate a front side and a rear side, respectively, and G1 and G2 of the longitudinal directions G1, G2 serving as predetermined directions of the present invention indicate an upstream side and a downstream side directions, respectively.

The fluid control assembly A1 comprises a plurality of base blocks 30, 10A to 10D, 30 disposed from the upstream side toward the downstream side in the longitudinal directions G1, G2, a joint block 150 connected with an introducing pipe 151, the switch valve (two-way valve) 110, a switch valve (three-way valve) 120, a mass flow controller 130, a switch valve (two-way valve) 140, and a joint block 160 connected with a connecting pipe 161 provided in that order from the upstream side toward the downstream side of these base blocks 30, 10A to 10D, 30.

The fluid control assembly A2 has the same configuration as the fluid control assembly A1.

The fluid control assembly A3 is provided with a joint block 135 to which a communicating pipe 136 is connected in place of the mass flow controller 130, on the base block 10C.

Note that the "fluid devices" of the present invention include various devices, such as fluid control devices used for controlling a flow of a fluid of a gas or liquid, and pressure gauges and joint blocks, that do not control the fluid, such as the pressure gauges and but are provided to the flow path, and the "fluid devices" are provided with a body defining a fluid flow path, and comprise at least two flow path ports that open at a bottom surface of this body. Specifically, the fluid devices include a switch valve (two-way valve), a regulator, a pressure gauge, a switch valve (three-way valve), a mass flow controller, and the like, but are not limited thereto.

To three fluid control assemblies A1 to A3 of the fluid control system 1, a process gas such as ammonia gas is introduced through the introducing pipe 151 of the fluid control assembly A1, a process gas such as hydrogen gas is introduced through the introducing pipe 151 of the fluid control assembly A2, and a purge gas such as nitrogen gas is introduced through the introducing pipe 151 of the fluid control assembly A3, for example.

Three switch valves (three-way valves) 120 are connected to one another by a communicating pipe 300, and thus the purge gas can be introduced to the flow path of the process gas.

The joint block 135 described above to which the communicating pipe 136 is connected is provided midway on the flow path in place of the mass flow controller 130 since the mass flow controller 130 is not required in the flow path of the purge gas.

A supply pipe part 400 includes the connecting pipes 161 connected to the three joint blocks 160 and a discharge pipe 162 connecting the connecting pipe 161, and is connected to a processing chamber (not illustrated) to supply the processed gas.

The plurality of base blocks 30, 10A to 10D, 30 disposed from the upstream side to the downstream side in the longitudinal directions G1, G2 are connected to one another and constitute the base block assembly BA, as illustrated in FIG. 5.

The base blocks 10A to 10D independently support the various fluid devices 110 to 140 described above, and play the role of providing a flow path that communicates the flow paths between the adjacent devices of the fluid devices 110 to 140.

The dimensions of the above-described base block assembly BA illustrated in FIG. 5 are about 10 mm in width and 20 mm in height, and a total length thereof is about 300 mm. The dimensions, however, are not necessarily limited thereto.

Among the plurality of base blocks constituting the base block assembly BA, the base blocks 30, 30 of an upstream side end portion and a downstream side end portion have the same dimensions and structure. The base blocks 10A to 10D constitute the first and second base blocks of the present invention, and specifically the base blocks 10A and 10B, 10B and 10C, and 10C and 10D have the same relationship as the first base block and the second base block of the present invention. These base blocks 10A to 10D have the same basic structure and thus, in this specification, the structure of the base blocks 10B and 10C will be described in detail with reference to FIG. 2A to FIG. 3C.

FIG. 2A to FIG. 2C show the structure of the base block 10B, FIG. 2A being an external perspective view, FIG. 2B being a top view, and FIG. 2C being a cross-sectional view cut in the longitudinal direction.

The base block 10B is a member made of a metal such as a stainless alloy, and comprises an upper surface 10a and a bottom surface 10b, which are flat surfaces opposite to each other, two side surfaces 10c, 10d, each orthogonal to the upper surface 10a and the bottom surface 10b, an end surface 10e1 on the upstream side in the longitudinal direction and orthogonal to the bottom surface 10b, and an end surface 10e2 on the downstream side in the longitudinal direction and orthogonal to the upper surface 10a.

As understood from FIG. 2C and the like, the base block 10B comprises an upstream side flow path 12 and a downstream side flow path 13 formed separately in the end surface 10e1 side and the end surface 10e2 side.

The upstream side flow path 12 comprises a first flow path 12c extending from a flow path port 12a, that opens on the upper surface 10a, toward the bottom surface 10b, and a second flow path 12d connected with the first flow path 12c in the interior of the base block 10B and extending toward the end surface 10e1.

The downstream side flow path 13 comprises a first flow path 13c extending from a flow path port 13a, that opens on the upper surface 10a, toward the bottom surface 10b, and a second flow path 13d connected with the first flow path 13c in the interior of the base block 10B and extending toward the end surface 10e2.

As described above and understood from the cross-sectional view of FIG. 2C, the upstream side flow path 12 and the downstream side flow path 13 are substantially L-shaped.

Around each of the flow path ports 12a, 13a, a holding part 15 for holding a gasket GK described later is formed, and on a bottom surface of this holding part 15, a protruding part 16 having a circular shape is concentrically formed with each of the flow path ports 12a, 13a, which is subjected to a hardening treatment that increases the hardness sufficiently higher than that of a formation material of the gasket GK to allow partial deformation of the gasket GK.

A screw hole 10h1 that opens on the upper surface 10a and allows screwing of a fastening bolt 50 serving as a fastening member is formed in the base block 10B, between the end surface 10e1 and flow path port 12a in the longitudinal direction. Further, a screw hole 10h2 that opens on the upper surface 10a and allows screwing of the fastening bolt 50 serving as a fastening member is formed in the base block 10B, near the end surface 10e2 side between the end surface 10e2 and flow path port 13a in the longitudinal direction. Further, the fastening bolts 50 used in the base blocks are M5 bolts with heads, but are not necessarily limited thereto.

In the base block 10B, a protruding pipe part 10p1 is formed to protrude in the longitudinal direction from the end surface 10e1, and a protruding pipe part 10p2 is formed to protrude in the longitudinal direction from the end surface 10e2. The protruding pipe part 10p1 communicates with the second flow path 12d described above, and defines a flow path port 12b by a tip surface 10p1e having a circular shape. The protruding pipe part 10p2 communicates with the second flow path 13d described above, and defines a flow path port 13b by a tip surface 10p2e having a circular shape.

The screw hole 10h1 is closed above the second flow path 12d, and is disposed to overlap with the second flow path 12d in a top view of the base block 10B as viewed from the upper surface 10a side (refer to FIG. 2B).

The screw hole 10h2 is closed above the second flow path 13d, and is disposed to overlap with the second flow path 13d in a top view of the base block 10B as viewed from the upper surface 10a side (refer to FIG. 2B).

A through hole that allows a fastening bolt to pass therethrough is not formed in the base block 10B. This point is the same for the other base blocks 10A, 10C, 10D, and 30 as well.

As is clear from FIG. 2C, the second flow paths 12d, 13d are disposed at positions biased to the bottom surface 10b side between the upper surface 10a and the bottom surface 10b of the base block 10B.

As described above, the screw holes 10h1, 10h2 are formed in positions overlapping with the flow paths 12d, 13d in a top view, and a through hole that allows a fastening bolt to pass therethrough is not formed in the base block 10B, making it possible to form the base block 10B to a very narrow width of 10 mm, for example. Furthermore, the second flow paths 12d, 13d are disposed at positions biased to the bottom surface 10b side, making it possible to select a fastening bolt having a diameter and a length for achieving the fastening force required for reliably securing a seal performance as the fastening bolt 50 screwed into the screw holes 10h1 and 10h2. Note that, when the screw hole depth can be secured, the second flow paths 12d, 13d need not be biased to the bottom surface 10b side.

In addition, since no through hole that allows a fastening bolt to pass therethrough is formed in the base block 10B, spaces for the flow paths 12, 13 are not restricted by such a through hole, making it possible to secure the cross-sectional areas of the flow paths 12, 13 as well.

It should be noted that, while an example is given in which the basic shape of the base block 10B is a rectangular parallelepiped shape, another shape can also be adopted. This point is the same for the other base blocks as well.

Here, a machining method of the flow path of the base block 10B described above is described.

The first flow paths 12c, 13c may form a blind hole by making a hole with a drill on the upper surface 10a of the base block 10B in the vertical direction. The second flow path 12d may be connected with the first flow path 12c by making a hole with a drill through the protruding pipe part 10p1 on the end surface 10e1 of the base block 10B in the longitudinal direction. The second flow path 13d may be connected with the first flow path 13c by making a hole with a drill through the protruding pipe part 10p2 on the end surface 10e2 of the base block 10B. According to such a method, machining is easier than machining for forming a so-called V-shaped flow path. Note that this point is the same for the machining method of the flow paths of the other base blocks as well. It should be noted that the protruding pipe parts 10p1, 10p2 can also be formed by machining from a block-shaped material, and pipes can also be bonded to the end surfaces by welding.

FIG. 3A to FIG. 3C show the structure of the base block 10C, FIG. 3A being an external perspective view, FIG. 3B being a top view, and FIG. 3C being a cross-sectional view cut in the longitudinal direction.

The basic structure of the base block 10C is the same as that of the base block 10B described above.

As illustrated in FIG. 3C, the flow path 12 of the base block 10C is formed near the end surface 10e1 on the upstream side in the longitudinal direction, the flow path 13 is formed near the end surface 10e2 on the downstream side in the longitudinal direction, and screw holes 10h3, 10h4 that open on the bottom surface 10b and extend toward the upper surface 10a are formed in two locations between the flow path 12 and the flow path 13 in the longitudinal direction. These screw holes 10h3, 10h4 are screw holes for attaching the base block 10C to the holding member 200 described later. Tip portions toward the upper surface 10a of the screw holes 10h3, 10h4 are closed in the interior of the base block 10C.

FIGS. 4A to 4C show the structure of the base block 30. The base block 30 is used on the upstream side end portion and the downstream side end portion of the base block assembly BA illustrated in FIG. 5. This base block 30, similar to the base blocks 10A to 10D described above, is a member made of a metal such as a stainless alloy, and comprises an upper surface 30a and a bottom surface 30b, which are flat surfaces opposite to each other, two side surfaces 30c, 30d, each orthogonal to the upper surface 30a and the bottom surface 30b, and an end surface 30e1 and an end surface 30e2 opposite to each other and orthogonal to the upper surface 30a, the bottom surface 30b, and the side surfaces 30c, 30d.

As understood from FIG. 4C and the like, the base block 30 comprises a flow path 32, and this flow path 32 comprises a first flow path 32c extending from a flow path port 32a, that opens on the upper surface 30a, toward the bottom surface 30b, and a second flow path 32d connected with the first flow path 32c in the interior of the base block 30 and extending toward the end surface 30e1, and is substantially L-shaped, as understood from the cross-sectional view of FIG. 4C. Further, the second flow path 32d is disposed at a position biased to the bottom surface 30b side between the upper surface 30a and the bottom surface 30b.

From the one end surface 30e1, a protruding pipe part 30p is formed to protrude and communicates with the second flow path 32d, and a tip surface 30pe, having a circular shape, of the protruding pipe part 30p defines a flow path port 32b of the flow path 32.

Around the flow path port 32a, a holding part 35 for holding the gasket GK described later is formed, and on a bottom surface of this holding part 35, a protruding part 36 having a circular shape is concentrically formed with the flow path port 32a, which is subjected to a hardening treatment that increases the hardness sufficiently higher than that of a formation material of the gasket GK to allow partial deformation of the gasket GK.

A screw hole 30h1 that opens on the upper surface 30a on the end surface 30e1 side toward the flow path port 32a and extends toward the bottom surface 30b is formed in the base block 30, and the screw hole 30h1 is closed above the second flow path 32d, and is formed in a position overlapping with the flow path 32d in the top view, as illustrated in FIG. 4B. Note that, when a depth of the screw hole 30h1 can be sufficiently secured, the second flow path 32d need not be biased to the bottom surface 30b side.

Further, a through hole 30h that passes from the upper surface 30a toward the bottom surface 30b is formed in the base block 30, on the end surface 30e2 side toward the flow path port 32a. A screw hole 30h2 having the same diameter as the screw hole 30$h$1 is formed on the upper surface 30$a$ side of the through hole 30$h$, and a screw hole 30$h$3 having a diameter smaller than that of the screw hole 30$h$2 is formed on the bottom surface 30$b$ side. The screw hole 30$h$3 is for fixing the base block 30 to the holding member 200 described later.

As illustrated in FIG. 5, in the base block assembly BA, the protruding pipe part 30$p$ of the base block 30 and the protruding pipe part 10$p$1 of the base block 10A, the protruding pipe part 10$p$2 of the base block 10A and the protruding pipe part 10$p$1 of the base block 10B, the protruding pipe part 10$p$2 of the base block 10B and the protruding pipe part 10$p$1 of the base block 10C, the protruding pipe part 10$p$2 of the base block 10C and the protruding pipe part 10$p$1 of the base block 10D, and the protruding pipe part 10$p$2 of the base block 10D and the protruding pipe part 30$p$ of the base block 30, are air-tightly or liquid-tightly butt-welded to each other via a welding material WL.

Note that while a case of butt-welding is illustrated in this embodiment, it is also possible to apply socket welding in which a joint having an inner diameter greater than an outer diameter of the protruding pipe parts is inserted into two protruding pipe parts and welded.

Further, rather than welding, the protruding pipe parts can also be air-tightly or liquid-tightly connected by threading an outer periphery of one protruding pipe part, providing a union nut to the other protruding pipe part, and screwing the union nut onto the outer periphery threads of the one protruding pipe part while interposing a gasket between the two protruding pipe parts.

FIG. 6A and FIG. 6B are drawings illustrating the switch valve (two-way valve) 110 as a fluid device, FIG. 6A being a front view and FIG. 6B being a bottom view.

The switch valve (two-way valve) 110 comprises a body 111, and a width of this body 111 matches the width of the base block assembly BA (refer to FIG. 1A to FIG. 1C), and is, for example, about 10 mm. However, the width is not limited thereto.

The body 111 defines flow paths 112, 113. These flow paths 112, 113 communicate in the interior of the switch valve (two-way valve) 110, and are opened and closed by a built-in control valve (not illustrated).

A flange part 111$f$ is formed in each of both side portions of the body 111 in the longitudinal direction, and a through hole 111$h$ for the fastening bolt 50 is formed in each of the flange parts 111$f$.

The flow paths 112, 113 respectively comprise flow path ports 112$a$, 113$a$ opening at a bottom surface 111$b$, and holding parts 114 for respectively holding the gaskets GK are formed around the flow path ports 112$a$, 113$a$. A protruding part 115 similar to the protruding part 16 having a circular shape and formed in the base block 10B is formed on the bottom surface of the holding part 114.

Note that, while the body 111 of the switch valve (two-way valve) 110 is illustrated, a body 121 of the switch valve (three-way valve) 120, a body 131 of the mass flow controller 130, and a body 141 of the switch valve (two-way valve) 140, which are other fluid devices, also match the base block assembly BA in width. Then, these bodies 121, 131, 141 each comprise two flow path ports on the bottom surface, and a flange part in which a through hole for the fastening bolt 50 is formed, as well as a holding part for holding the gasket GK and a projection having a circular shape. A detailed description of these fluid devices is omitted.

Next, assembly procedures of the fluid control system according to this embodiment will be described with reference to FIG. 7 to FIG. 10B.

Figure 7:
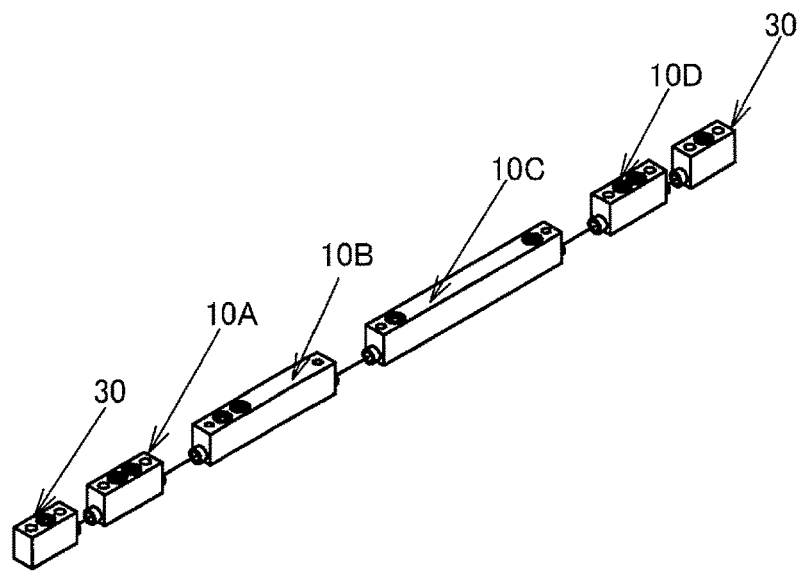
FIG. 7 is a drawing showing an assembly procedure of the fluid control system in FIG. 1A.

First, as illustrated in FIG. 7, the protruding pipe parts between the base block 30, the base block 10A, the base block 10B, the base block 10C, the base block 10D, and the base block 30 are air-tightly or liquid-tightly connected by butt-welding, and the required number of base block assemblies BA is prepared.

Figure 8A:
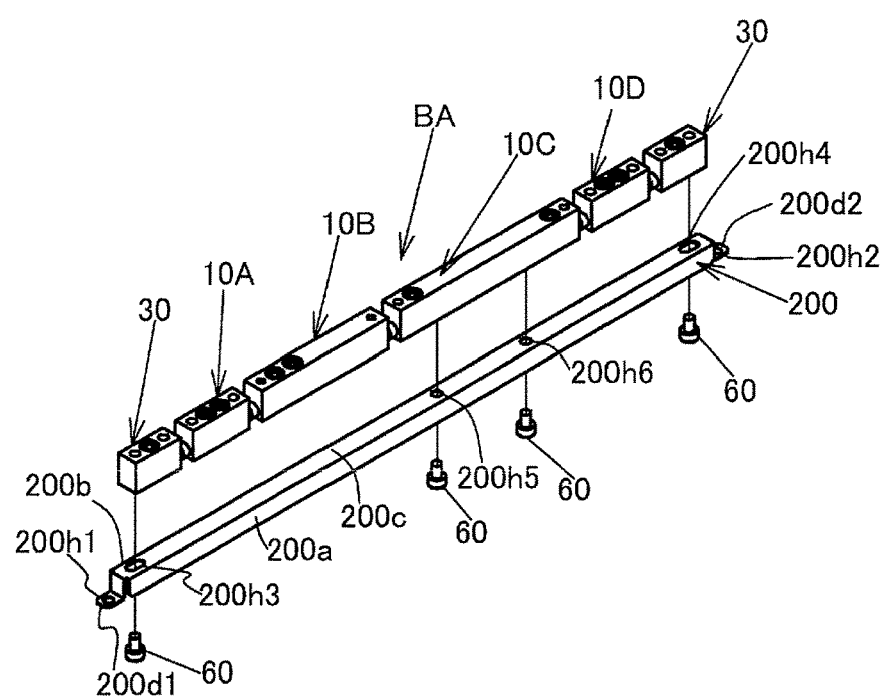
FIG. 8A is a drawing showing the assembly procedure, continuing from FIG. 7.

Next, as illustrated in FIG. 8A, the base block assembly BA is attached to the holding member 200. The holding member 200 is obtained by molding a metal plate, and comprises counter wall parts 200$a$, 200$b$ facing each other in the longitudinal direction, a holding part 200$c$ coupling the counter wall parts 200$a$, 200$b$, attachment parts 200$d$1, 200$d$2 formed on both end portions in the longitudinal direction, through holes 200$h$1, 200$h$2 formed in the attachment parts 200$d$1, 200$d$2, long holes 200$h$3, 200$h$4 formed in both end portions of the holding part 200$c$ in the longitudinal direction, and through holes 200$h$5, 200$h$6 formed in two locations in a middle portion of the holding part 200$c$ in the longitudinal direction. The long holes 200$h$3, 200$h$4 are formed in positions corresponding to the screw holes 30$h$3 respectively formed in the base blocks 30 on the upstream side and the downstream side, and the through holes 200$h$5, 200$h$6 are formed in positions corresponding to the screw holes 10$h$3, 10$h$4 formed in the base block 10C. The base block assembly BA is fixed to the holding member 200 by screwing the M4 fastening bolts 60 from the back side of the holding part 200$c$ of the holding member 200 into the screw holes through the long holes 200$h$3, 200$h$4 and the through holes 200$h$5, 200$h$6.

Figure 8B:
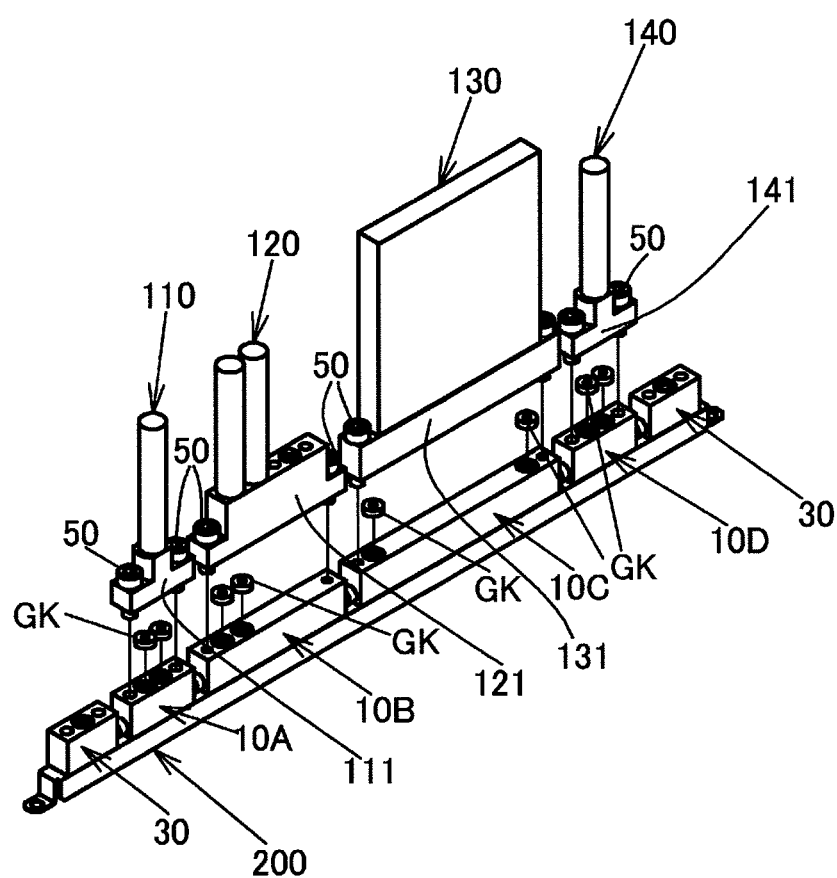
FIG. 8B is a drawing showing the assembly procedure, continuing from FIG. 8A.

Next, as illustrated in FIG. 8B, the various fluid devices 110 to 140 are installed onto the base block assembly BA held by the holding member 200. At this time, the gaskets GK are disposed as a seal member around the flow path ports that open on the bottom surfaces of bodies 111 to 141 of the various fluid device 110 to 140, and the flow path ports formed on the upper surfaces 10$a$ of the base blocks of the base block assembly BA corresponding thereto. Then, the fastening bolts 50 are screwed into the screw holes of the base blocks of the base block assembly BA through the bodies 111 to 141, thereby coupling the bodies 111 to 141 of the various fluid devices 110 to 140 to the corresponding base blocks 10A to 10D, and pressing the gaskets GK between the bodies 111 to 141 and the base blocks 10A to 10D by the fastening force of the fastening bolts 50. As a result, the fluid control assemblies A1 to A3 are assembled.

Examples of the gasket GK include a gasket made of a metal, a resin, or the like.

Examples of the gasket include a soft gasket, a semi-metal gasket, a metal gasket, and the like. Specifically, the gaskets below are preferably used.

Figure 9A:
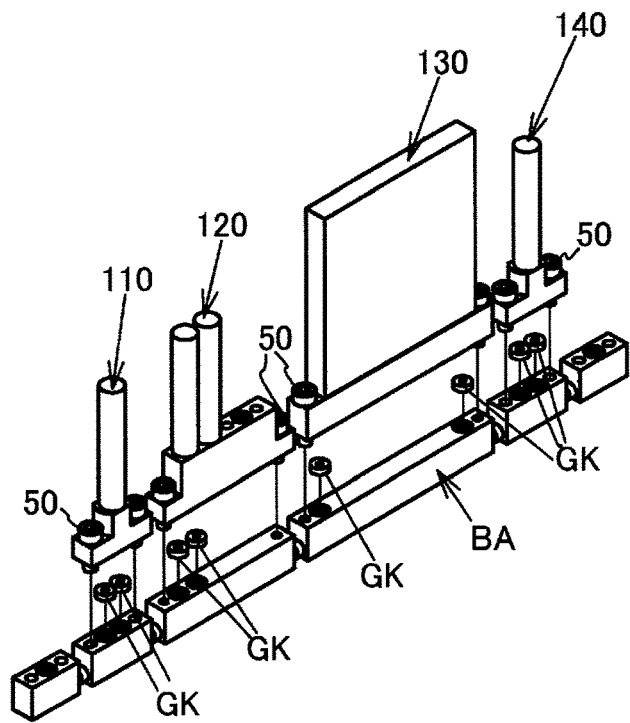
FIG. 9A is a drawing showing the assembly procedure, continuing from FIG. 7.
Figure 9B:
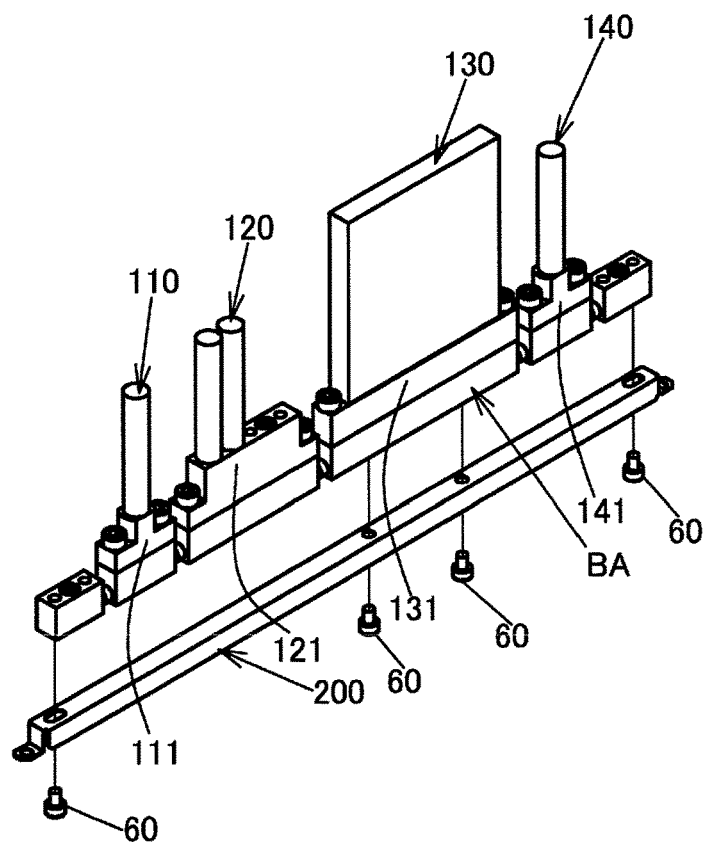
FIG. 9B is a drawing showing the assembly procedure, continuing from FIG. 9A.

(1) Soft Gasket
Rubber O-ring
Rubber sheet (for a flat face)
Joint sheet
Expanded graphite sheet
Polytetrafluoroethylene (PTFE) sheet
Polytetrafluoroethylene (PTFE) jacket type (2) Semi-Metal Gasket
Spiral-wound gasket
Metal jacket gasket (3) Metal Gasket
Metal flat gasket
Metal hollow O-ring
Ring joint FIG. 9A and FIG. 9B show assembly procedures alternative to the assembly steps illustrated in FIG. 8A and FIG. 8B.

As illustrated in FIG. 9A, after the various fluid devices 110 to 140 are assembled to the base block assembly BA, the base block assembly BA to which the various fluid devices 110 to 140 are assembled is fixed to the holding member 200, as illustrated in FIG. 9B. As a result, the fluid control assemblies A1 to A3 similar to those obtained by the steps in FIG. 8A and FIG. 8B are obtained.

Figure 10A:
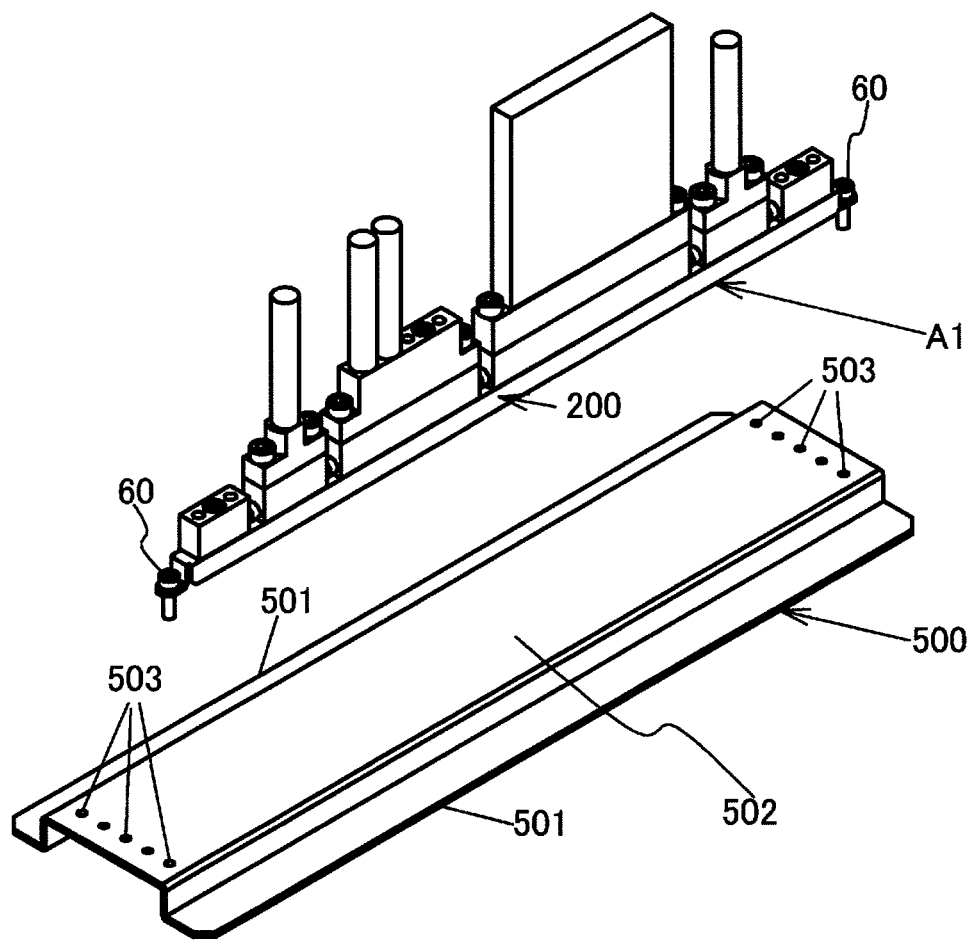
FIG. 10A is a drawing showing the assembly procedure, continuing from FIG. 8B or FIG. 9B.

Next, the fluid control assemblies A1 to A3 thus assembled are each fixed by screwing a fastening bolt 60 into a screw hole 503 in a desired position of the installation surface 502 of the base plate 500, as illustrated in FIG. 10A. As a result, the fluid control assemblies A1 to A3 are arranged in parallel on the installation surface 502 of the base plate 500.

Figure 10B:
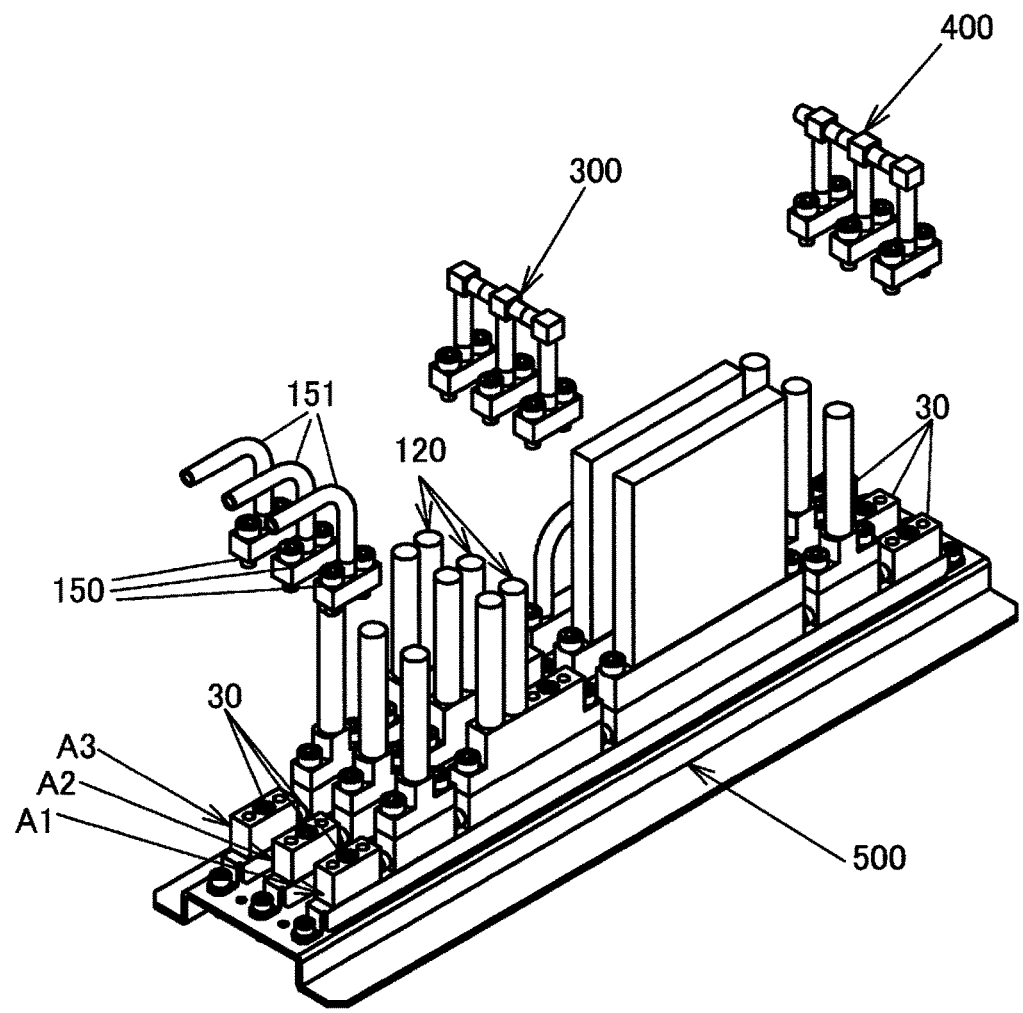
FIG. 10B is a drawing showing the assembly procedure, continuing from FIG. 10A.

Next, the joint block 150 is installed on the base block 30 of the upstream side end portion of the fluid control assemblies A1 to A3, the communicating pipe 300 is installed on the three switch valves (three-way valves) 120, and the supply pipe part 400 is installed on the base block 30 of the downstream side end portion, as illustrated in FIG. 10B. As a result, the fluid control system 1 is formed.

As described above, in this embodiment, the screw holes 10$h$1, 10$h$2 of the base blocks 10A to 10D are formed in positions overlapping with the flow paths 12$d$, 13$d$ in a top view, and no through holes that allow the fastening bolts to pass therethrough are formed in the base blocks 10A to 10D and the base block 30. Thus, it is possible to significantly narrow the dimensions, particularly the width, of the base block while securing the cross-sectional area of the fluid flow paths to the extent possible.

Note that, in the embodiment described above, while a case where the three fluid control assemblies A1 to A3 are disposed apart from each other on the installation surface 502 of the base plate 500 is illustrated, a maximum of five fluid control assemblies can be installed on the base plate 500 of this embodiment. That is, a fluid control assembly can be installed between the fluid control assembly A1 and the fluid control assembly A2, and between the fluid control assembly A2 and the fluid control assembly A3.

While, in the embodiment described above, a case where two flow path ports are defined in the body of the fluid device is illustrated, the present invention is not limited thereto, for example, and a fluid device including a body in which three flow path ports (not illustrated) are formed on the bottom surface is also be subject to the present invention.

While, in the configuration of the above-described embodiment, the base block assembly BA is attached to the base plate 500 via the holding member 200, the configuration is not limited thereto, and the base block assembly BA can also be directly attached to the base plate 500.

Next, application examples of the fluid control system 1 described above will be described with reference to FIG. 11.

Figure 11:
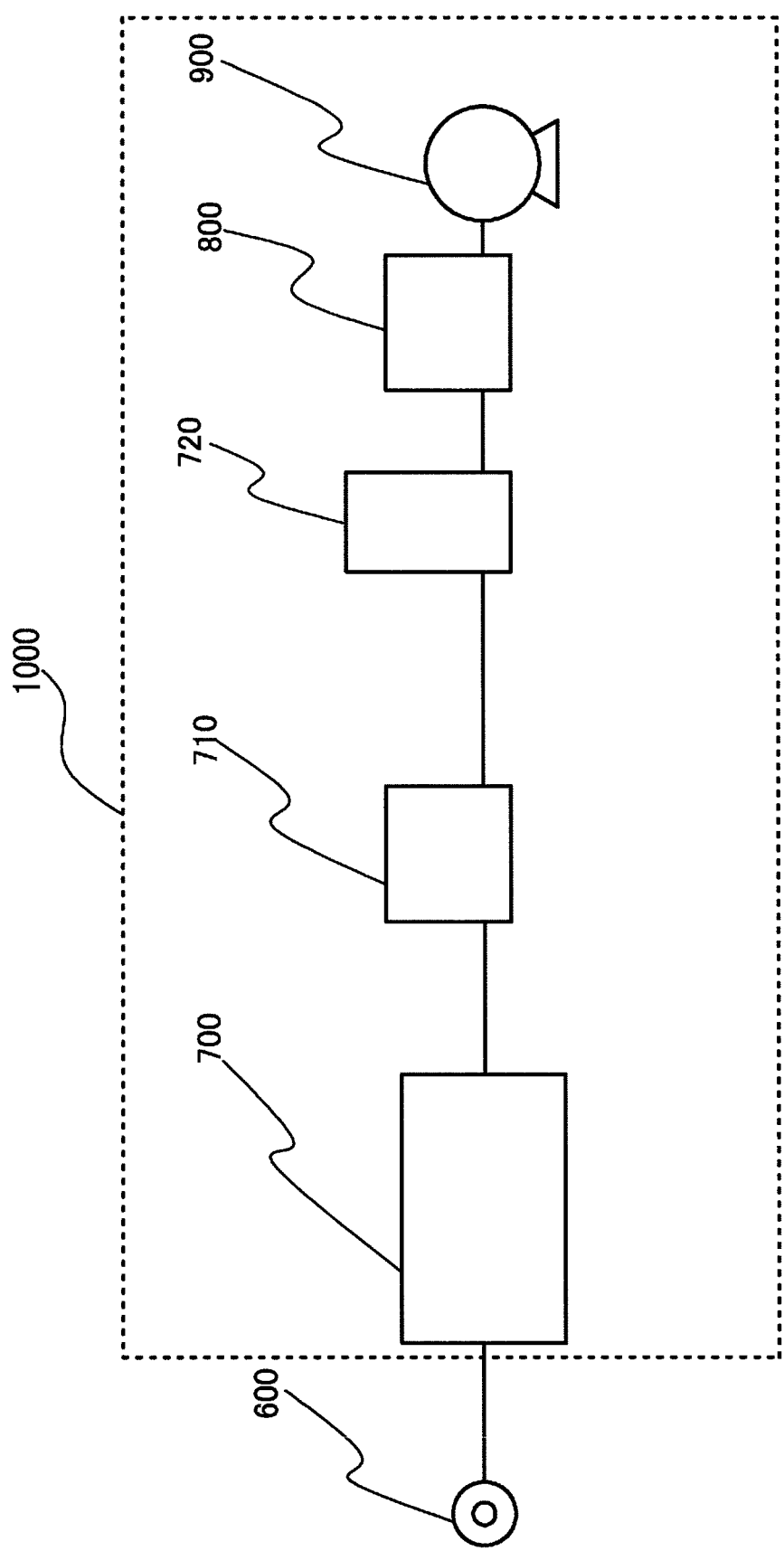
FIG. 11 is a schematic diagram of a semiconductor manufacturing system according to an embodiment of the present invention.

A semiconductor manufacturing system 1000 illustrated in FIG. 11 is a system for executing a semiconductor manufacturing process by atomic layer deposition (ALD), with 600 denoting a process gas supply source, 700 denoting a gas box, 710 denoting a tank, 800 denoting a processing chamber, and 900 denoting an exhaust pump.

In a treatment process that deposits a film on a substrate, in order to supply a process gas in a stable manner, the process gas supplied from the gas box 700 is temporarily stored in the tank 710 as a buffer, and a valve 720 provided close to the processing chamber 800 is opened and closed at high frequency, supplying the process gas from the tank to the processing chamber in a vacuum atmosphere.

The ALD is one type of chemical vapor deposition, and a method in which, under film deposition conditions such as temperature and time, two or more types of process gases are allowed to alternately flow on the substrate surface, one type at a time, and caused to react with atoms on the substrate surface and thus deposit films, one layer at a time. This method allows control per atom layer, making it possible to form a uniform film thickness and grow the film very finely, even in terms of film quality.

In the semiconductor manufacturing process based on the ALD method, the flow rate of the process gas needs to be precisely adjusted and secured to a certain extent by increasing a size of a diameter of the substrate or the like.

The gas box 700 is a box that houses the fluid control system 1, obtained by integrating the various fluid control devices described in the above-described embodiment, to supply an accurately measured process gas to the processing chamber 800.

The tank 710 functions as a buffer for temporarily storing the process gas supplied from the gas box 700.

The processing chamber 800 provides a sealed treatment space for forming a film on the substrate by the ALD method.

The exhaust pump 900 draws a vacuum inside the processing chamber 800.

DESCRIPTIONS OF REFERENCE NUMERALS

1 Fluid control system
10A, 10B, 10C, 10D Base block
10$a$ Upper surface
10$b$ Bottom surface
10$c$, 10$d$ Side surface
10$e$1, 10$e$2 End surface
10$h$1, 10$h$2, 10$h$3, 10$h$4 Screw hole
12 Upstream side flow path
12$a$, 12$b$ Flow path port
12$c$ First flow path
12$d$ Second flow path
13 Downstream side flow path
13$c$ First flow path
13$d$ Second flow path
13$a$, 13$b$ Flow path port
15 Holding part
16 Protruding part
30 Base block
30$a$ Upper surface
30$b$ Bottom surface
30$c$, 30$d$ Side surface
30$e$1, 30$e$2 End surface
30$h$ Through hole
30$h$1, 30$h$2, 30$h$3 Screw hole
50, 60 Fastening bolt
110 Switch valve (two-way valve)
111 Body
111$b$ Bottom surface
111$f$ Flange part
111$h$ Through hole
112, 113 Flow path
112$a$, 113$a$ Flow path port
114 Holding part
115 Protruding part
120 Switch valve (three-way valve)
121 Body
130 Mass flow controller
131 Body
135 Joint block 136 Communicating pipe
140 Switch valve (two-way valve)
141 Body
150 Joint block
151 Introducing pipe
160 Joint block
161 Connecting pipe
162 Discharge pipe
200 Holding member
300 Communicating pipe
400 Supply pipe part
500 Base plate
501 Support part
502 Installation surface
503 Screw hole
600 Process gas supply source
700 Gas box
710 Tank
720 Valve
800 Processing chamber
900 Exhaust pump
1000 Semiconductor manufacturing system
A1, A2, A3 Fluid control assembly
BA Base block assembly
G1 Longitudinal direction (upstream side)
G2 Longitudinal direction (downstream side)
GK Gasket
W1 Width direction (front side)
W2 Width direction (rear side)
WL Welding material

What is claimed is:

1. A fluid control system comprising:
first and second base blocks disposed on an upstream side and a downstream side in a predetermined direction, each defining an upper surface, a bottom surface opposite to the upper surface, and an upstream side end surface and a downstream side end surface extending from the upper surface toward the bottom surface side and opposite to each other in the predetermined direction; and
first and second fluid devices respectively installed on the upper surfaces of the first and second base blocks, and provided with a body defining a fluid flow path and two flow path ports of the fluid flow path on a bottom surface of the body, wherein:
the first and second base blocks each comprises:
an upstream side flow path and a downstream side flow path formed separately on an upstream side and a downstream side in the predetermined direction; and
an upstream side screw hole and a downstream side screw hole formed on an upstream side and a downstream side in the predetermined direction, each opening on the upper surface, and extending toward the bottom surface side;
the upstream side flow path and the downstream side flow path each comprise a first flow path extending from a flow path port that opens on the upper surface toward the bottom surface, and a second flow path connected with the first flow path in an interior of the base block and extending toward the upstream side end surface or the downstream side end surface in the predetermined direction;
the upstream side screw hole and the downstream side screw hole of the first and second base blocks are each disposed so as to at least partially overlap with the corresponding second flow path in a top view, and are closed above the corresponding second flow path;
the first and second base blocks and the bodies of the first and second fluid devices are respectively coupled by a fastening force of fastening bolts passed through the bodies of the first and second fluid devices and screwed into the upstream side screw hole and the downstream side screw hole of the first and second base blocks, and seal members disposed around the flow path ports on the upper surface of the base blocks respectively abutted against the corresponding flow path ports of the bodies of the first and second fluid devices, are pressed between the first and second base blocks and the bodies of the first and second fluid devices;
the first and second base blocks each comprises protruding pipe parts that protrude from the upstream side end surface and the downstream side end surface in the predetermined direction;
the protruding pipe parts each communicate with the corresponding second flow path; and
the protruding pipe part on the downstream side end surface of the first base block and the protruding pipe part on the upstream side end surface of the second base block are air-tightly or liquid-tightly connected.

2. The fluid control system according to claim 1, wherein the first and second base blocks are provided with no through holes for allowing a fastening member to pass therethrough.

3. The fluid control system according to claim 1, wherein the second flow path is disposed at a position biased to the bottom surface side between the upper surfaces and the bottom surfaces.

4. The fluid control system according to claim 1, further comprising:
a base block assembly formed by connecting a plurality of base blocks that define a fluid flow path, including the first and second base blocks, to one another, wherein:
the fluid devices are independently installed on the base block assembly;
the base blocks constituting the base block assembly are provided with no through holes for allowing a fastening member to pass therethrough.

5. A flow control method, comprising:
providing the fluid control system according to claim 1; and controlling a flow rate of a process gas supplied from the fluid control system.

6. A product manufacturing method, comprising:
providing the fluid control system according to claim 1; and controlling the process gas supplied from the fluid control system to a sealed chamber during a manufacturing process of a product that requires a treatment process within the sealed chamber.

7. A semiconductor manufacturing system comprising:
a fluid control system for supplying a process gas to a processing chamber, the fluid control system including the fluid control system according to claim 1.

8. The product manufacturing method according to claim 6, further comprising: manufacturing the product as one of a semiconductor device, a flat panel display or a solar panel.

* * * * *